United States Patent
Mirhosseini-Schubert

(10) Patent No.: US 10,090,434 B2
(45) Date of Patent: Oct. 2, 2018

(54) ILLUMINATION DEVICE HAVING DUAL-EMITTING LIGHT EMITTING DIODE (LED) DIE STRUCTURES

(71) Applicant: Apple Inc., Cupertino, CA (US)

(72) Inventor: Roya Mirhosseini-Schubert, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 136 days.

(21) Appl. No.: 14/838,171

(22) Filed: Aug. 27, 2015

(65) Prior Publication Data

US 2016/0254410 A1 Sep. 1, 2016

Related U.S. Application Data

(60) Provisional application No. 62/121,366, filed on Feb. 26, 2015.

(51) Int. Cl.
| | |
|---|---|
| *H01L 33/08* | (2010.01) |
| *H01L 33/06* | (2010.01) |
| *H01L 33/50* | (2010.01) |
| *H05B 33/08* | (2006.01) |
| *H04N 5/225* | (2006.01) |
| *H04N 5/235* | (2006.01) |

(52) U.S. Cl.
CPC .............. *H01L 33/08* (2013.01); *H01L 33/06* (2013.01); *H01L 33/502* (2013.01); *H04N 5/2256* (2013.01); *H04N 5/2354* (2013.01); *H05B 33/0857* (2013.01)

(58) Field of Classification Search
CPC .............................. H01L 33/502; H01L 33/08
See application file for complete search history.

(56) References Cited

U.S. PATENT DOCUMENTS

| | | | | |
|---|---|---|---|---|
| 7,005,679 | B2* | 2/2006 | Tarsa | H01L 25/0753 257/100 |
| 7,026,651 | B2* | 4/2006 | Yamada | H01L 25/0753 257/79 |
| 7,323,721 | B2 | 1/2008 | Liao et al. | |
| 7,825,574 | B2 | 11/2010 | Brunner et al. | |
| 8,801,205 | B2 | 8/2014 | Harbers et al. | |
| 9,072,148 | B2* | 6/2015 | Tanaka | H01L 25/0753 |
| 2006/0006366 | A1 | 1/2006 | Abramov et al. | |
| 2007/0030675 | A1* | 2/2007 | Oon | G03B 15/05 362/237 |
| 2010/0246176 | A1* | 9/2010 | Shyu | F21V 5/007 362/235 |

FOREIGN PATENT DOCUMENTS

| | | | |
|---|---|---|---|
| EP | 2573451 | | 3/2013 |
| JP | 2011192738 | * | 9/2011 |

* cited by examiner

*Primary Examiner* — Michael Carter
(74) *Attorney, Agent, or Firm* — Womble Bond Dickinson (US) LLP

(57) ABSTRACT

An illumination device has a dual-emitting LED die structure in which a first p-n diode structure emits primary light having a peak at a first wavelength, and a second p-n diode structure emits primary light having a peak at a second wavelength that is longer than the first wavelength. A phosphor medium is positioned to be stimulated by the primary light of the dual-emitting LED die structure, and in response emits secondary, wavelength converted light, thereby contributing to a combined white illumination. Other embodiments are also described and claimed.

13 Claims, 4 Drawing Sheets

ILLUMINATION DEVICE HAVING DUAL-EMITTING LIGHT EMITTING DIODE (LED) DIE STRUCTURES

This application claims the benefit of the earlier filing date of U.S. Provisional Patent Application No. 62/121,366, filed Feb. 26, 2015.

FIELD

An embodiment of the invention relates to illumination devices that use lighting emitting diode (LED) die structures, and in particular those that may be used for photography strobe applications. Other embodiments are also described.

BACKGROUND

LED die structures have made in roads into a variety of illumination devices over the past decade, in particular as the main illumination device of a photography strobe (camera flash). The use of LED die structures allows fine-grained electronic control of the intensity of the illumination as well as its color. As an example, a camera flash may contain two LED chips, where one is designed to produce a cool white output, while the other is designed to produce a warm white output. The cool white chip includes an LED die structure covered with a yellow phosphor, while the warm white chip has another LED die structure that is covered with yellow and red phosphors. When stimulated by a primary light from the LED die, the phosphor emits secondary, wavelength-converted light at a longer wavelength, such that the combination of the secondary wavelength-converted light and the primary light emitted from the two LED dies structures (typically blue LEDs that are within +/−10 nm, for example) result in a combined, white illumination. In one case, the cool white portion of the flash may be designed to produce a correlated color temperature (CCT) of 5500K. The warm white chip produces a warmer light, at a target CCT of 2800K. Each of the LED die structures is driven with a regulated current independently of the other, so as to control the intensity of the combined white illumination as well as the shade of the white illumination. In other words, the combined white illumination may be varied between 2800K (warm) and 5500K (cool), by varying the ratio of the regulated currents that are applied to the two LED die structures. For example, to obtain 5000K (a cool white light), more current is injected into the cool white chip than into the warm light LED chip.

SUMMARY

Although the conventional technique described above in the Background for obtaining a range of combined white illumination, between cool and warm light, is a practical approach, a problem that may be encountered is that the two different color phosphor mediums exhibit a two tone color combination that is clearly visible to a naked human eye. For cosmetic reasons, it may be desirable for an illumination device to exhibit a single or uniform color in its off state, while still being able to adjust the intensity and color temperature of the combined illumination between warm and cool white light.

An embodiment of the invention is an illumination device that has a dual-emitting LED die structure. The dual-emitting LED die structure has a first diode structure that emits primary light having a peak at a first wavelength, and a second diode structure that emits primary light have a peak at a second wavelength that is longer than the first wavelength. A phosphor medium is positioned so as to be stimulated by both of the primary light emissions of the dual-emitting LED die structure, and in response emits secondary, wavelength-converted light. The phosphor medium may comprise a first phosphor material and a second, different phosphor material. For example, a yellow phosphor material and a red phosphor material may be mixed to form the phosphor medium (although more than two phosphors may also be used). The combined illumination, namely the primary light and the secondary, wavelength converted light, is white light whose color temperature may be varied between cool and warm by adjusting the ratio of the forward currents that are being conducted in the first and second diode structures during emission. The combined illumination may be adjustable between cool and warm, by considering (1) the ratio of a peak wavelength of the primary light emitted by the second p-n diode structure to the secondary emitted light from one of the phosphors, and (2) the ratio of a peak wavelength emitted by the primary light of the first p-n diode structure to the peak wavelength of the secondary emitted by the second phosphor material, and by adjusting the ratio of forward currents of the first and second p-n diode structures.

In one embodiment, there are two or more of the dual-emitting LED die structures that are positioned side-by-side to form the illumination device, where these may or may not be replicates. In addition, two or more of the phosphor mediums, which may be replicates, are provided, where each phosphor medium is positioned to cover a respective one of the two or more dual-emitting LED die structures. The two or more phosphor mediums may be sufficiently similar in their outside appearance, so that when the illumination device is turned off they appear uniform in color to a naked human eye. Alternatively, the two or more phosphor mediums may be described as being uniform in color, or appear to have the same color, as viewed from outside of the device.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one. Also, in the interest of conciseness or reducing the total number of drawings, a given figure may be used to illustrate the features of more than one embodiment of the invention, and not all elements in the figure may be required for a given embodiment.

DETAILED DESCRIPTION

Several embodiments of the invention with reference to the appended drawings are now explained. Whenever the shapes, relative positions and other aspects of the parts described in the embodiments are not explicitly defined, the scope of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

Figure 1:
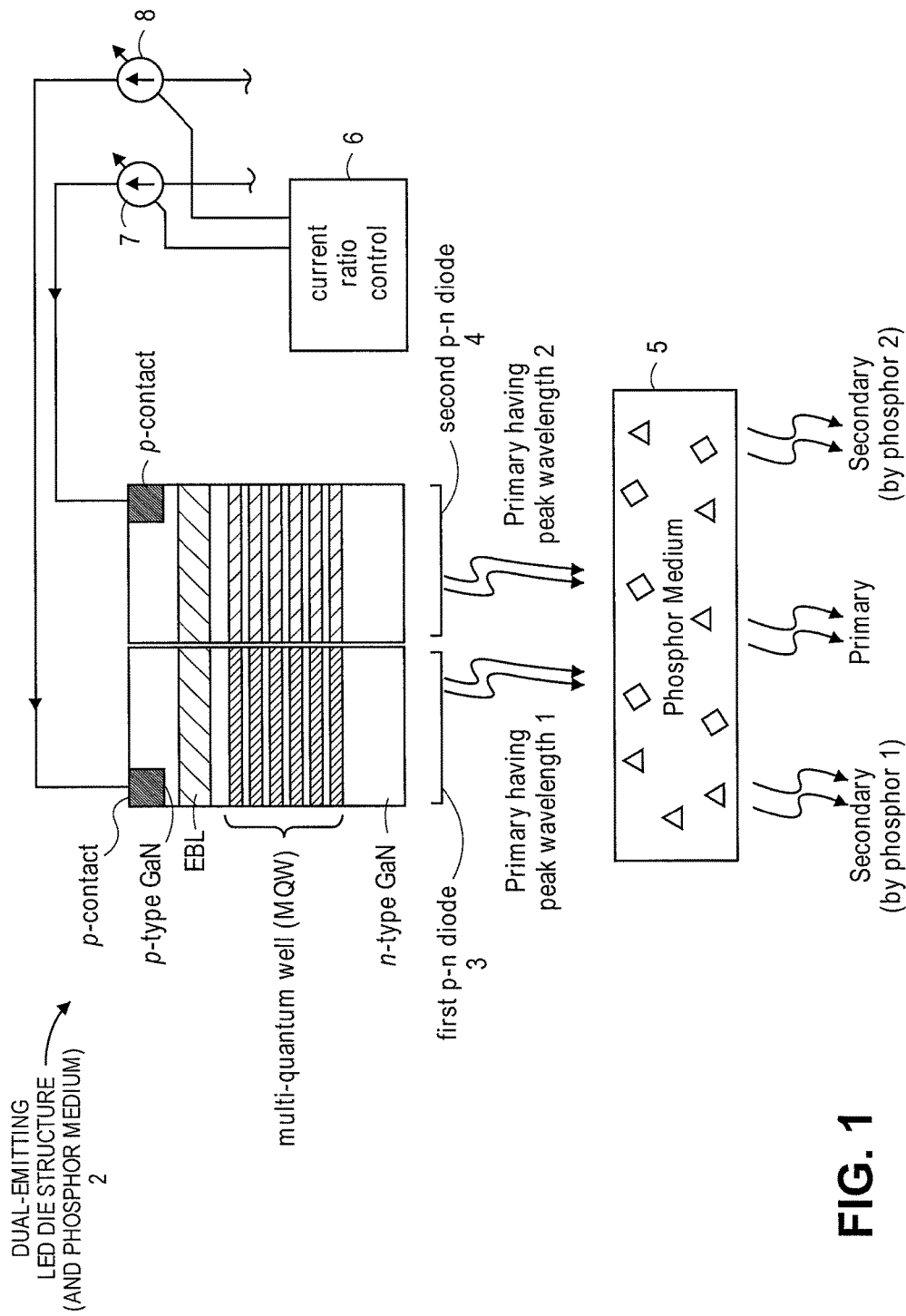
FIG. 1 illustrates a dual-emitting LED die structure and its associated phosphor medium, in accordance with an embodiment of the invention.

FIG. 1 illustrates a dual-emitting LED die structure 2 and its associated phosphor medium 5, in accordance with an embodiment of the invention. The dual-emitting LED die structure 2 has a first diode region that is adjacent to a second diode region. In this case, each region is composed of a stack of semiconductor layers, an example of which is given in the drawing and may be described as follows. An n-type gallium nitride (GaN) layer is followed by a multi-quantum well (MQW) layer stack, which is followed by an electron barrier layer (EBL) and then topped with a p-type GaN layer. Although not shown, there is an electrical contact that may be made to be n-type GaN layers, while p-contact regions are provided for the p-type GaN regions. These two p-n diode structures are different in that the first is to emit primary light having a peak at a first wavelength, while the second is to emit primary light having a peak at a second wavelength that is longer than the first wavelength. For example, the first diode may be designed to emit blue light whereas the second diode may be designed to emit a shorter wavelength shade of blue, e.g. cyan light. The intensity of the primary light emissions may be controlled by a current ratio control circuit 6 as shown, which in one embodiment can adjust independently the forward current through each p-n diode structure via the respective coupled current sources 7, 8 as shown. The term "current source" is used generally here and may refer to be either a true current source or a current sink, and may have complex current regulation circuitry that insures a steady or fixed current that can be varied (by the current ratio control 6) in order to set the intensity of the primary light produced by each diode.

In addition to the first and second diode structures, FIG. 1 also shows that a phosphor medium 5 is positioned so as to be stimulated by the primary light from the dual-emitting LED die structure, including both peak wavelengths 1 and 2, and in response, emit secondary, wavelength-converted light. For instance, the latter may have at least one peak that is at a third wavelength which is longer than the second wavelength, or longer than the first wavelength. More particularly, in the example shown, the phosphor medium 5 contains two different phosphors, namely phosphor 1 and phosphor 2 which may be phosphor materials of different colors (e.g., a yellow phosphor material and a red phosphor material). The phosphor materials are selected in order to result in a combined illumination that combines that portion of the primary emitted from both diodes that has passed through the phosphor medium with the two types of secondary emitted by the two different phosphors, to generate white light. Here, white light may be defined by, for example, any suitable chromaticity specification, e.g. a CIE 1931 color space.

Figure 2:
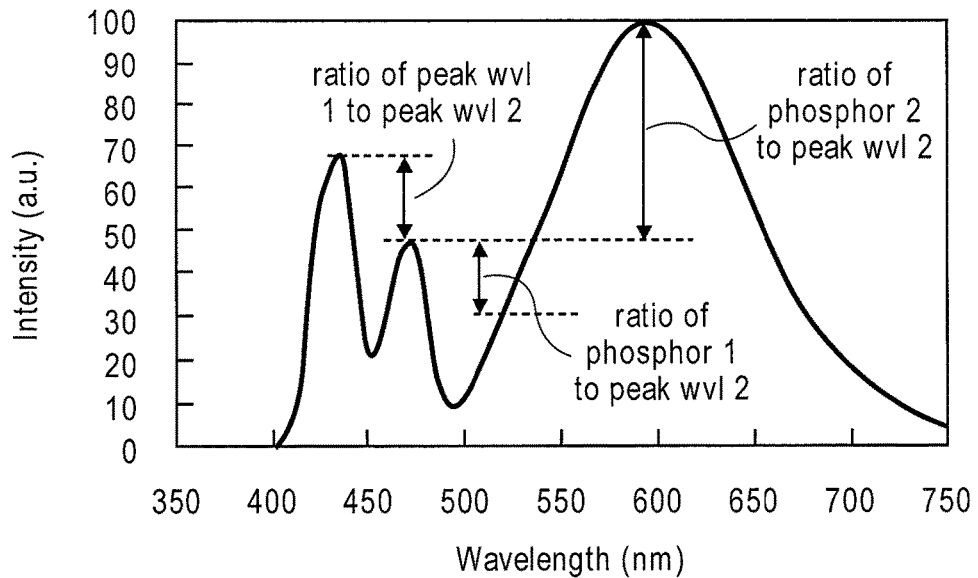
FIG. 2 is a plot of normalized emitted light intensity versus wavelength for an example dual-emitting LED die structure having two different phosphor materials in its phosphor medium.

FIG. 2 illustrates an example intensity versus wavelength plot of the combined illumination of the dual-emitting LED die structure 2 and phosphor medium 5 of FIG. 1, in accordance with an example. The light intensity plot in this case shows the ratio of intensity at peak wavelength 1 to peak wavelength 2, where it should be understood that the first diode produces primary light having a peak at wavelength 1 while the second diode produces primary light having a peak at wavelength 2. The ratio of the two peaks can be adjusted using the current ratio control circuit 6, which sets the individual forward currents of the two diodes. FIG. 2 also indicates another interesting ratio to consider (when designing or engineering the shade of white of the combined illumination), namely a ratio of a secondary emission by phosphor 1 to the peak at wavelength 2, and the ratio of secondary emission by phosphor 2 in relation to the peak at wavelength 2. It should be noted that each phosphor may be stimulated or activated by both primary wavelengths 1 and 2. The ratios depicted in FIG. 2 may be adjusted by appropriately controlling the type of phosphor material used as well as the ratio of the forward currents of the two diodes, in order to obtain a combined white illumination that is pleasing for a desired purpose, e.g. illuminating a scene during flash photography. In one embodiment, the combined illumination of the twin or dual-emitting LED diode structure may be adjusted, for example, from a cool white color having a correlated color temperature (CCT) of 5500K, to a warm light having a CCT of 2800K, by varying the ratio of the p-n diode forward currents.

In the example depicted in FIG. 2, it can be seen that the diode structures are such that the first peak wavelength (produced by the first diode) is shorter than the second peak wavelength. In particular, as another example, these primary emissions may represent different shades of blue, where, in this case, the first peak wavelength may be a shorter wavelength blue while the second wavelength is a longer wavelength blue (e.g., cyan). The two diode structures may, however, be designed to have other primary emissions (e.g., different than blue). This may be done by, for example, suitably designing the p-n junction structures including the type of semiconductor materials used, as well as the structure of the MQW.

In a further example that is depicted here, the phosphor medium 5 contains only two phosphor materials, i.e., two different phosphor materials that exhibit different emission wavelengths. In this case, phosphor 1 has a shorter peak emission wavelength than phosphor 2. In other embodiments, there may be more than two phosphor materials that have been mixed together to form the phosphor medium 5, or that may be otherwise combined to form the phosphor medium 5, and where the two or more different phosphor materials may each have a different peak emission wavelength. Furthermore, the luminous efficiency of each phosphor material could be different, and this aspect should be taken into consideration when determining the levels of the p-n diode currents $I_1:I_2$. For example, in one case, phosphor 1 may be of a type that is more efficiently stimulated by the primary emission peak wavelength from the first diode, whereas phosphor 2 may be more efficiently stimulated by the primary emission from the second diode. The selection of the types of phosphor materials that are combined within the phosphor medium 5 and the current ratio $I_1:I_2$ can be analyzed in a laboratory setting in view of the combined illumination that is produced, in order to obtain the desired shade of white illumination from a single, dual-emitting LED die structure.

Referring back to FIG. 1, the dual-emitting LED die structure 2 may be produced as a single semiconductor die or chip having a first p-n junction structure as shown on the left, and a second p-n junction structure as shown on the right of the figure. Each of these p-n junction structures may have a p-type region that is coupled to a first p-contact, so that separate p-contacts are available to be coupled to a dual output current source circuit 7, 8 as shown. Alternatively, each of the n-type regions may be coupled to a separate n-contact (which are then coupled to the dual output current source circuit 7, 8.

The first and second diode structures may be electrically isolated from each other, in the example of FIG. 1 using a vertically oriented electrical isolation barrier. Of course, when the n-type regions are coupled to a common reference voltage node such as ground, the diode structures are no longer electrically isolated. Accordingly, "electrically isolated" here refers to the regions of the diode structures other than the n-type regions (or p-type regions) as the latter may be coupled to each other and to a reference potential.

Figure 3:
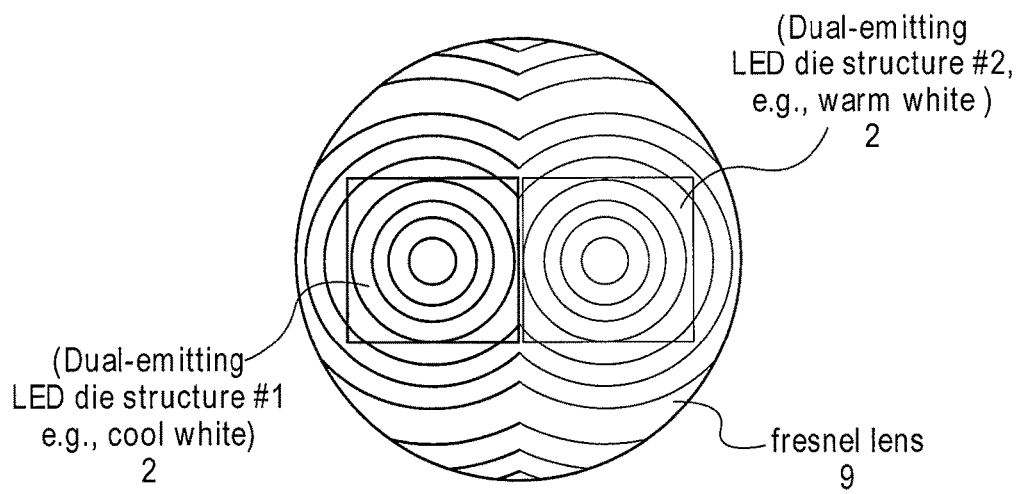
FIG. 3 is a top-down view of a camera flash module that contains two of the dual-emitting LED die structures (and their associated phosphor mediums) where each is covered by a Fresnel lens.

Turning now to FIG. 3, this is an embodiment of the invention in which two of the dual-emitting LED die structures 2 of FIG. 1 (and their associated phosphor mediums 5) have been joined into a single illumination device, in particular, as a camera flash module 13. In this case, the two dual-emitting LED die structures 2 may be replicates, and also their associated phosphor mediums may also be replicates. However, the two units (of dual-emitting LED die structures) can still be operated independently, to produce different shades of white. For example, in FIG. 3, the unit on the right is operated by appropriately setting its current ratio $I_1:I_2$ (see FIG. 1) to achieve a warm white illumination, whereas the left hand unit has its current ratio adjusted differently so that a cool white illumination is produced. The combination of cool white and warm white from the two units may provide the desired level of white illumination, for a given flash photography capture. As suggested above, the p-n diode current ratio of each unit (or each dual-emitting LED die structure 2—see FIG. 1) may be electronically controlled so as to make the flash illumination more cool or more white, by adjusting the amount of warm illumination produced by the right hand unit in FIG. 3 as compared to the amount of cool white illumination produced by the left hand unit. In this particular application of a camera flash, a Fresnel lens 9 is provided that covers each of the dual-emitting LED die structures 2, although in other applications or products, a Fresnel lens may not be needed. In all of such cases, however, it can be appreciated that the beneficial result of exhibiting a uniform or single color appearance outside of the camera flash module 13 is achieved, especially because the phosphor mediums 5 are replicates. It should be noted, however, that in another embodiment, the phosphor mediums 5 need not be replicates but rather may be sufficiently close in color (as to their outside appearance) so that they would not be distinguishable on the outside (when the camera flash or illumination device is turned off) to the naked eye of a human viewer.

Figure 4:
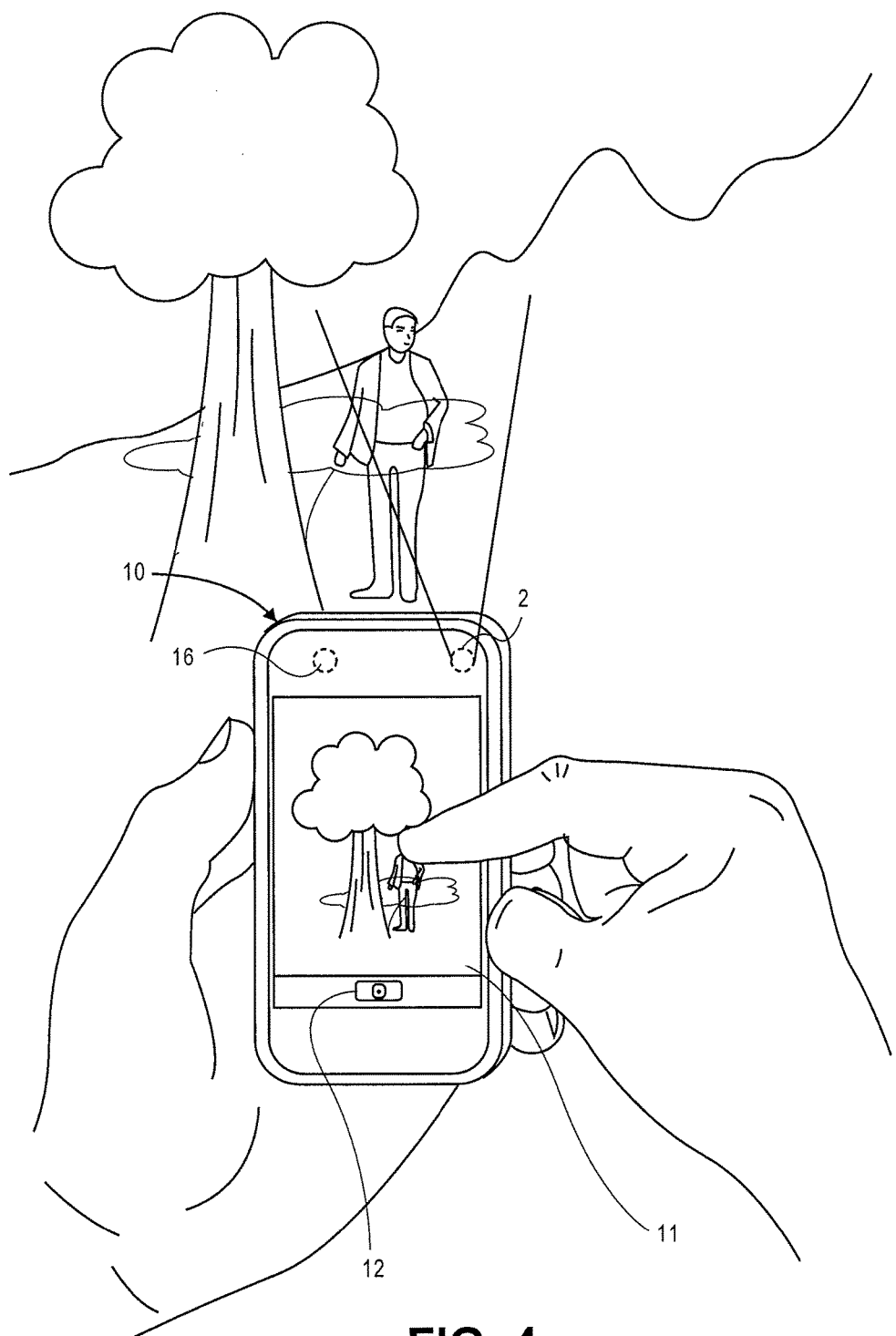
FIG. 4 shows a portable camera device in which a camera flash module is integrated.
Figure 5:
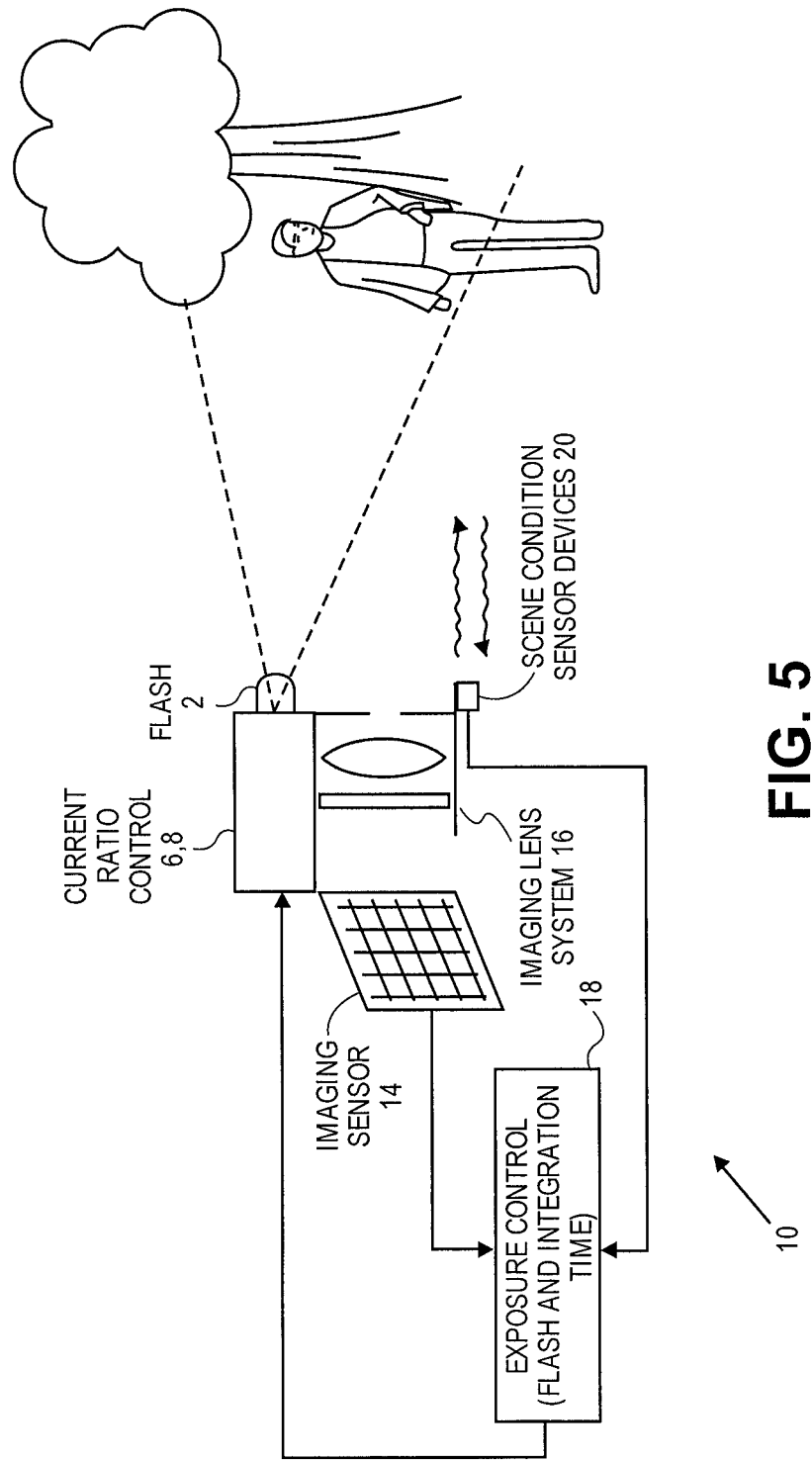
FIG. 5 is a block diagram of some of the relevant components of the portable camera device.

The particular embodiment of an illumination device in which a Fresnel lens 9 is used may be especially desirable in combination with a digital camera, where the illumination device described above as a camera flash module 13 in FIG. 3 is integrated in a handheld portable camera device 10 such as the one depicted in FIG. 4. The camera device 10 has a body or housing (e.g., that of a smartphone, a tablet computer, a lap top computer, or other portable consumer electronic device) that has integrated therein a photography strobe module (camera flash module 13) that contains two or more units of the dual emitting die structure 2 (and their associated phosphor mediums 5), an imaging lens system 16 which is aimed at the scene to form an optical image of the scene on an imaging sensor (see FIG. 5), and a shutter button 12 which the user manually actuates for taking a picture using the imaging sensor. In the embodiment shown, an integrated touch sensitive screen 11 is used to implement a camera viewfinder function and the shutter button functionality, as in a conventional smartphone or table computer.

The management or high-level functions of the camera device 10 may be performed by a digital data processor (not shown) that is executing program code or instructions that are stored in the device 10, e.g. in non-volatile solid-state memory. The camera functionality of the device 10 may be obtained by the following combination of components working with each other in accordance with known techniques: imaging sensor 14, imaging lens system 16 (which may include an autofocus lens mechanism), camera flash module 13 containing two or more units of the dual emitting LED die structure 2, current ratio control and current source circuits 6, 7, 8, optional scene condition sensor devices 20, and exposure control circuit 18. The latter may monitor the shutter button 12 for actuation by the user, and adjust exposure settings including integration time of the imaging sensor 14, and desired camera flash intensity and color settings for the current ratio control circuit 6, to illuminate a scene that is being captured (optionally based on scene lighting conditions and other known photography parameters). Although not shown, enhancements such as white balance and color correction may be performed on the resulting digital images that have been captured by the sensor 14, before transferring the still pictures or video to internal camera storage in a popular digital photography file format such as JPEG, PNG or QUICKTIME. The still picture or video files may then be transferred out of the device 10 by an external I/O interface (not shown) which may be for a high speed serial bus such as one that complies with an Institute of Electrical and Electronics Engineers, IEEE, Standard 1349 or a Universal Serial Bus, USB, specification, a flash memory card, a wired local area network (LAN) such as Ethernet, a wireless LAN, or by a short range wireless link such as a Bluetooth link. The digital camera device 10 would include a programmed processor or hardwired circuitry as part of the exposure control circuit 18 to control operation of an illumination device as described above, by communicating with the current ratio control circuit 6 (see FIG. 1) so that the illumination device functions as a photography strobe which is adjustable to provide different colors of white illumination or different shades of white illumination upon the scene being captured.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. For example, while FIG. 1 shows that the p-contacts are electrically connected to the dual output current source 7, 8, an alternative is to instead connect the n-contacts (not shown) to the dual output current source 7, 8 where in that case the dual output current source is more properly described as a dual output current sink circuit (and the direction of the arrows would be reversed). Also, in that case, the p-contacts of the two p-n diode structures could be connected to a reference voltage node other than ground, e.g. a positive power supply voltage. In another instance, while the phosphor mediums described above contain two phosphors, a phosphor medium may alternatively include more than two different phosphors. The description is thus to be regarded as illustrative instead of limiting.

What is claimed is:

1. An illumination device comprising:
   first and second dual emitting LED die structures, each having a first diode structure that is to emit primary light having a peak at a first wavelength, and a second diode structure that is to emit primary light having a peak at a second, longer wavelength;
   a first phosphor medium positioned to be stimulated by the primary light of the first dual emitting LED die structure; and
   a second phosphor medium positioned to be stimulated by the primary light of the second dual emitting LED die structure, wherein in response to being stimulated by the primary light, the first and second phosphor mediums emit secondary wavelength-converted light, and wherein the first and second phosphor mediums are uniform in color as viewed from outside of the device when the illumination device is turned off,
   and the first and second dual emitting LED die structures are configured to be independently operable from one another so that each of the first and second dual emitting LED die structures can produce a different, color temperature adjustable combined illumination wherein a first combined illumination and a second combined illumination having differently adjusted color temperatures are combined.

2. The illumination device of claim 1 further comprising:
   a first current source circuit that has dual outputs which are coupled to the first and second diode structures, respectively, of the first dual emitting LED die structure, wherein the dual outputs conduct first and second regulated currents, respectively, wherein a first current ratio of the first and second regulated currents of the first current source circuit is adjustable so as to obtain a first combined illumination from the first dual emitting LED die structure and the stimulated first phosphor that is a cooler white; and
   a second current source circuit that has dual outputs which are coupled to the first and second diode structures, respectively, of the second dual emitting LED die structure, wherein the dual outputs conduct first and second regulated currents, respectively, wherein a second current ratio of the first and second regulated currents of the second current source circuit is adjustable differently than the first current ratio so as to obtain a second combined illumination from the second dual emitting LED die structure and the stimulated second phosphor that is a warmer white.

3. The illumination device of claim 2 further comprising a Fresnel lens structure that covers the first and second phosphor mediums.

4. The illumination device of claim 2 wherein each of the first and second dual emitting LED die structures is a separate single semiconductor die or chip having 1) a first p contact that is coupled to a p-type region of the first diode structure and 2) a second p contact that is coupled to a p-type region of the second diode structure.

5. The illumination device of claim 1 wherein the first and second phosphor mediums are replicates.

6. The illumination device of claim 1 wherein the first wavelength is a shorter wavelength blue, and the second wavelength is a longer wavelength blue.

7. The illumination device of claim 1 wherein the first or second phosphor medium comprises a first phosphor material and a second, different phosphor material.

8. The illumination device of claim 7 wherein the second phosphor material has greater luminous efficiency than the first phosphor material, and also has a longer peak emission wavelength than the first phosphor material.

9. The illumination device of claim 7 wherein the first phosphor material is a yellow or green phosphor material, and the second phosphor material is a yellow or red phosphor material.

10. The illumination device of claim 1 wherein the first diode structure comprises a semiconductor stack having a multi-quantum well (MQW) layer stack that is designed to produce light having a peak at the first wavelength, and the second diode structure comprises a semiconductor stack having a multi-quantum well (MQW) layer stack that is designed to produce light having a peak at the second wavelength.

11. The illumination device of claim 1 wherein the first diode structure is electrically isolated from the second diode structure.

12. The illumination device of claim 11 wherein the first diode structure is electrically isolated from the second diode structure except at their respective n-type regions which are coupled to each other.

13. The illumination device of claim 11 wherein the first diode structure is electrically isolated from the second diode structure except that their respective p-type regions are coupled to each other.

* * * * *